(12) United States Patent
Smith et al.

(10) Patent No.: US 10,014,424 B2
(45) Date of Patent: Jul. 3, 2018

(54) REDUCED JUNCTION AREA BARRIER-BASED PHOTODETECTOR

(71) Applicant: Raytheon Company, Waltham, MA (US)

(72) Inventors: Edward P. Smith, Santa Barbara, CA (US); Borys P. Kolasa, Santa Barbara, CA (US); Paul M. Alcorn, Groton, MA (US)

(73) Assignee: RAYTHEON COMPANY, Waltham, MA (US)

(*) Notice: Subject to any disclaimer, the term of this patent is extended or adjusted under 35 U.S.C. 154(b) by 0 days.

(21) Appl. No.: 14/630,046

(22) Filed: Feb. 24, 2015

(65) Prior Publication Data
US 2015/0263204 A1 Sep. 17, 2015

Related U.S. Application Data

(60) Provisional application No. 61/952,197, filed on Mar. 13, 2014.

(51) Int. Cl.
| | | |
|---|---|---|
| *H01L 27/14* | (2006.01) | |
| *H01L 31/102* | (2006.01) | |
| *H01L 31/0352* | (2006.01) | |
| *H01L 31/09* | (2006.01) | |
| *H01L 31/101* | (2006.01) | |

(52) U.S. Cl.
CPC ......... *H01L 31/0352* (2013.01); *H01L 31/09* (2013.01); *H01L 31/101* (2013.01)

(58) Field of Classification Search
CPC ......... H01L 31/035272; H01L 31/1844; H01L 31/0352; H01L 31/09; H01L 31/101; H01L 31/1013; H01L 27/14647

USPC ..... 257/431, 188, 442, E27.13; 438/57, 478, 438/80, 98
See application file for complete search history.

(56) References Cited

U.S. PATENT DOCUMENTS 4,875,084 A * 10/1989 Tohyama .......... H01L 27/14649
257/436
5,773,831 A * 6/1998 Brouns .................. G01J 5/28
250/338.4

(Continued)

FOREIGN PATENT DOCUMENTS

WO   WO 2013/040184 A1   3/2013

OTHER PUBLICATIONS

Prashant P. Baveja, Benjamin Kögel, Petter Westbergh, Johan S. Gustavsson, Åsa Haglund, Drew N. Maywar, Govind P. Agrawal, Anders Larsson, Impact of Device Parameters on Thermal Performance of High-Speed Oxide-Confined 850-nm VCSELs, IEEE Journal of Quantum Electronics, vol. 48, No. 1, Jan. 2012, pp. 17-26 (10 pages) Fig. 1.

(Continued)

*Primary Examiner* — Dzung Tran
(74) *Attorney, Agent, or Firm* — Daly, Crowley, Mofford & Durkee, LLP

(57) ABSTRACT

A photodetector structure having a barrier layer disposed between a pair of like-conductively doped semiconductor layers, the barriers layer having a surface area smaller than the surface area of the upper one of the pair of semiconductor layers. A fill material is disposed between outer peripheral edges of the barrier layer and a region between outer peripheral edges of the first and second layers.

9 Claims, 8 Drawing Sheets

(56) References Cited

U.S. PATENT DOCUMENTS

| | | | | |
|---|---|---|---|---|
| 2004/0119129 A1* | 6/2004 | Giboney | H01L 31/101 | 257/458 |
| 2007/0090337 A1* | 4/2007 | Ueno | B82Y 20/00 | 257/13 |
| 2007/0158664 A1* | 7/2007 | Rothman | H01L 27/144 | 257/88 |
| 2007/0215900 A1* | 9/2007 | Maimon | B82Y 20/00 | 257/184 |
| 2007/0235758 A1* | 10/2007 | Klipstein | H01L 31/101 | 257/188 |
| 2008/0111152 A1* | 5/2008 | Scott | H01L 27/14603 | 257/188 |
| 2009/0001278 A1* | 1/2009 | Jones | H01L 27/14647 | 250/370.13 |
| 2011/0095334 A1* | 4/2011 | Scott | H01L 27/1446 | 257/188 |
| 2013/0062593 A1* | 3/2013 | Jones | H01L 31/035236 | 257/21 |
| 2013/0228887 A1* | 9/2013 | Wehner | H01L 27/1446 | 257/432 |

OTHER PUBLICATIONS

Torsten Wipiejewski, Hans-Dietrich Wolf, Lutz Korte, Wolfgang Huber, Günter Kristen, Charlotte Hoyler, Harald Hedrich, Oliver Kleinbub, Tony Albrecht, Jürgen Müller, Andreas Orth, Zeljko Spika, Stephan Lutgen, Hartwig Pflaeging, Jörg Harrasser, Karstan Drüogemüller, Volker Plickert, Detlef Kuhl, Jürgen Blank, Doris Pietsch, Herwig Stange, Holger Karstensen, VCSELs for datacom applications, 9 pages , Fig. 3 *Proceedings of the SPIE*, vol. 3627, pp. 14-22, 1999.

Michalzik, Rainer, and Karl Joachim Ebeling. "Operating principles of VCSELs." *Vertical-Cavity Surface-Emitting Laser Devices*. Springer Berlin Heidelberg, 2003. 53-98. Fig. 1, vol. 6 2003 of the series *Springer Series in Photonics* pp. 53-98.

* cited by examiner

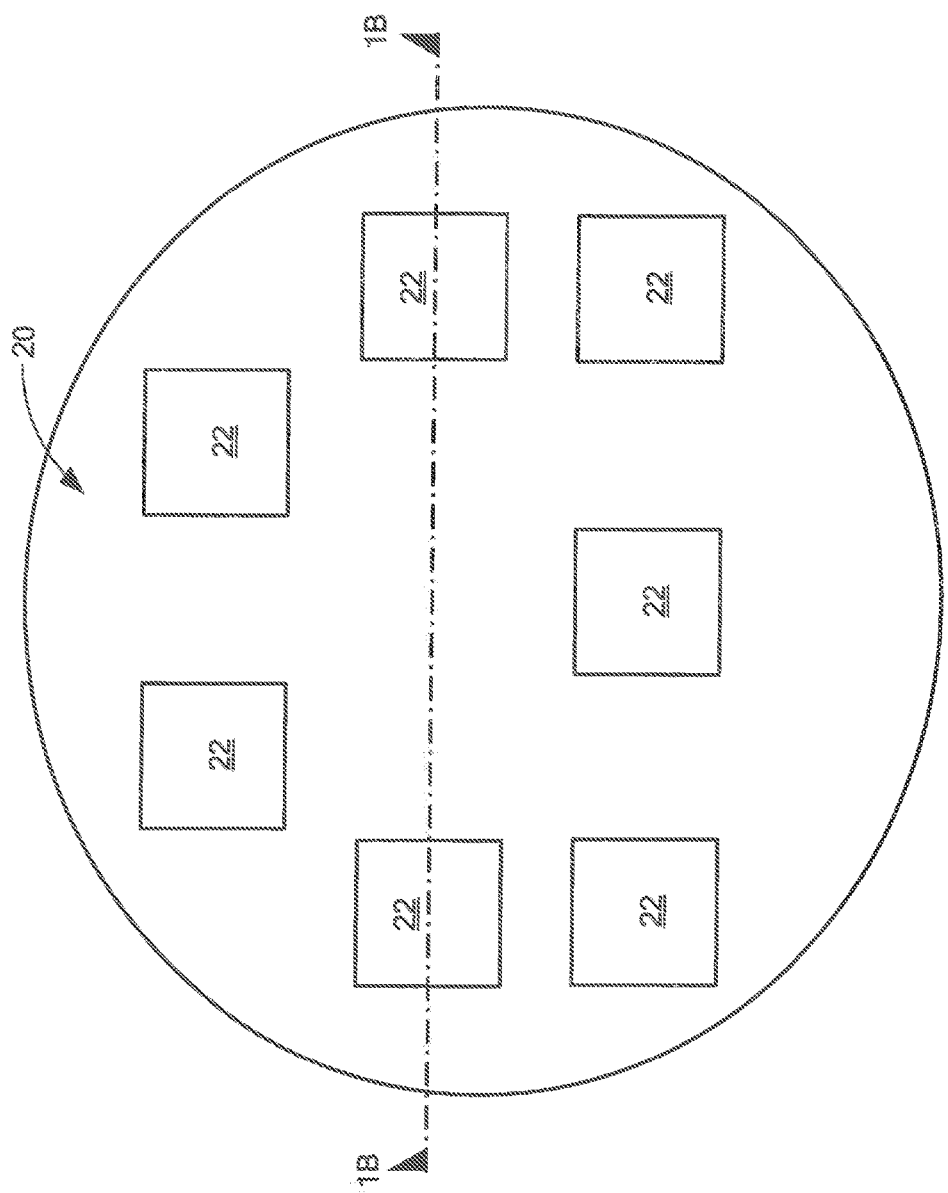

REDUCED JUNCTION AREA BARRIER-BASED PHOTODETECTOR

CROSS REFERENCE TO RELATED APPLICATION

This application claims priority from U.S. Provisional application Ser. No. 61/952,197 filed on Mar. 13, 2014, which is incorporated herein by reference.

TECHNICAL FIELD

This disclosure relates generally to photodetectors and more particularly to photodetectors having a barrier layer disposed between a pair of like-conductively doped semiconductor layers.

BACKGROUND

As is known in the art, one type of infrared detector is an nBn or pBp structure having a bottom, or collector, semiconductor layer of a first type conductivity and an upper contact semiconductor layer of the same first type conductivity with a barrier layer sandwiched between the upper and lower semiconductor layers. In the case of the pBp structure the upper and bottom layers are p-type doped layers and in the cease of the nBn structure the upper and bottom layers are n-type doped layers. In one example, the upper and bottom layers are InAsSb, and the middle layer is AlAsSb. A reverse bias voltage is applied between the upper and lower layers. Thus, in the case of the nBn structure, the bottom layer is, for example, at ground potential and the upper layer is at a negative potential relative to ground potential. In response to infrared radiation, minority carriers, holes, pass between the upper and lower layers and through the barrier layer while the barrier layer prevents the flow of majority carriers. Unfortunately, the barrier layer can produce unwanted dark current

SUMMARY

In accordance with the present disclosure, a photodetector structure is provided having a barrier layer disposed between a pair of like-conductively doped semiconductor layers, the barriers layer having a surface area smaller than the surface area of the upper one of the pair of semiconductor layers.

In one embodiment, a fill material is disposed between outer peripheral edges of the barrier layer and a region between outer peripheral edges of the first and second layers.

In one embodiment, a method is provided for forming a photodetector structure having a barrier layer disposed between a pair of like-conductively doped semiconductor layers. The method includes selectively removing outer peripheral portions of the barrier layer while leaving outer peripheral portions of the upper and lower layers.

In one embodiment, the selectively removing comprises exposing the structure to a selective etch, such selective etch selectively removing the outer peripheral portions of the barrier layer while leaving unetched the outer peripheral portions of the upper and lower layers.

In one embodiment, the selectively removing leaves a gap between the upper and lower layers, such gap having as sidewalls remaining portions of the barrier layer and including filling the gaps with a filler material.

In one embodiment, the filling comprises using atomic layer deposition.

With such as arrangement a junction with reduced area mitigates generation-recombination and surface current mechanisms that can have a deleterious effect on device performance. Isolating the contact and absorption regions at the sidewall surface also can negate shunt currents. To put it another way, the junction area is diminished while the absorption volume is maintained. Backfilling the void maintains pixel integrity. Maintaining the shape or volume of the entire pixel in this manner retains existing designs and fabrication processes, allowing any scalability inherent to the original process.

The details of one or more embodiments of the disclosure are set forth in the accompanying drawings and the description below. Other features, objects, and advantages of the disclosure will be apparent from the description and drawings, and from the claims.

DESCRIPTION OF DRAWINGS

FIG. 2A is a top view of the wafer of FIG. 1B;

Like reference symbols in the various drawings indicate like elements.

DETAILED DESCRIPTION

Figure 1A:
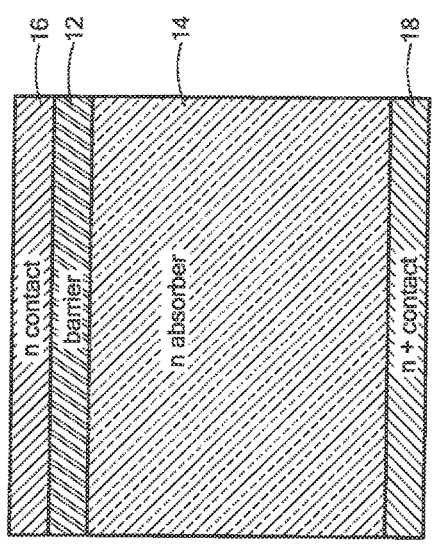
FIG. 1A is a cross sectional view of a semiconductor wafer structure having a bottom, or collector, semiconductor layer of a first type conductivity and an upper contact semiconductor layer of the same first type conductivity with a barrier layer sandwiched between the upper and lower semiconductor layers at an initial stage in the processing thereof.

Referring now to FIG. 1A a wafer 10 is shown having a barrier layer 12 disposed, here sandwich, between a pair of like-conductively doped semiconductor layers 14, 16. Here, the bottom layer 14 is n-type conductivity, here for example. InAsSb, absorber layer, and the upper layer 16 is a contact layer also here, for example, n-type conductivity, InAsSb. Here, the wafer 10 includes an n+-type conductive contact layer 18 under the bottom layer 14, as shown. Here, the contact layer 18 is connected to ground potential and the upper layer 16 is connected to a potential negative with respect to ground potential.

Figure 1B:
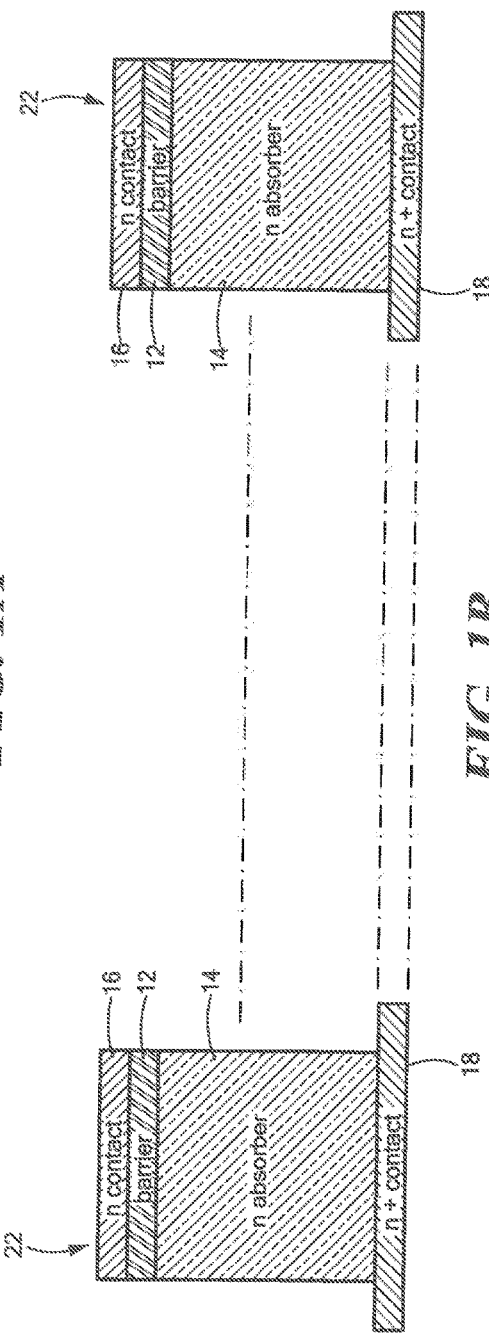
FIG. 1B is a cross sectional view of a portion of the structure of FIG. 1A after a plurality of infrared photodetector pixel elements are etched into the wafer, such cross section being taken along line 1B-1B in FIG. 1B.
Figure 2C:
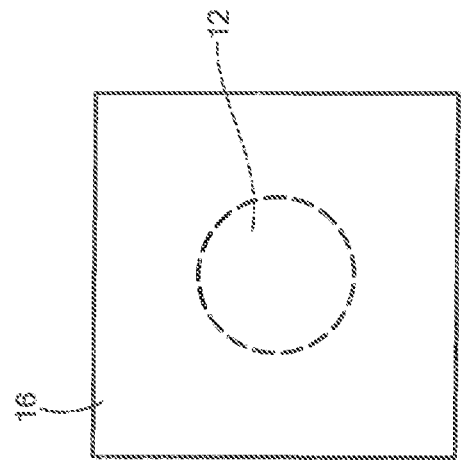
FIG. 2C is a top view of the exemplary o as the infrared photodetector pixel elements of FIG. 1D.

Referring now to FIGS. 1B and 2A, a plurality or array 20 of mesas 22 are etched into the upper surface of the wafer 10 down to the contact layer 18, as shown, using conventional lithographic-etching processing. Here, the delineation etch is based on a tartaric acid, phosphoric acid, and hydrogen peroxide dilution. Each of one of mesas 22 corresponds to one of a plurality of photodetectors in the array 20.

Figure 1D:
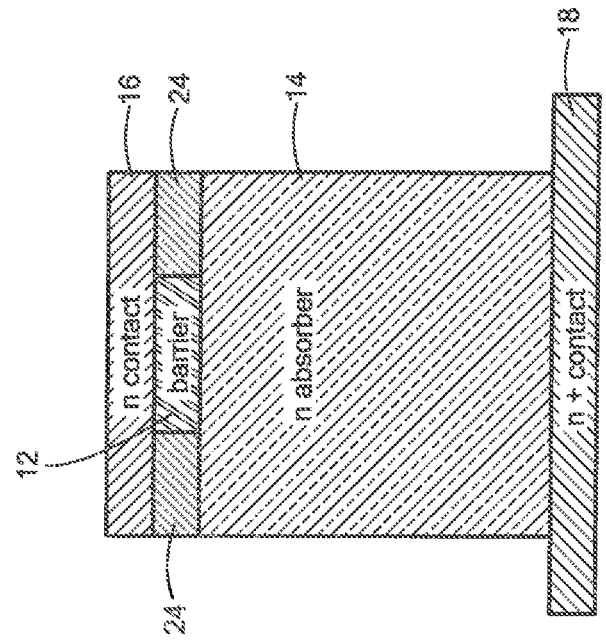
FIG. 1D is a cross sectional view of the an exemplary one of the infrared photodetector pixel elements of FIG. 1C after a gap formed between the upper and lower layers after the selective removal, such gap having sidewalls remaining, such gap being filled with a filler material according to the disclosure.
Figure 1C:
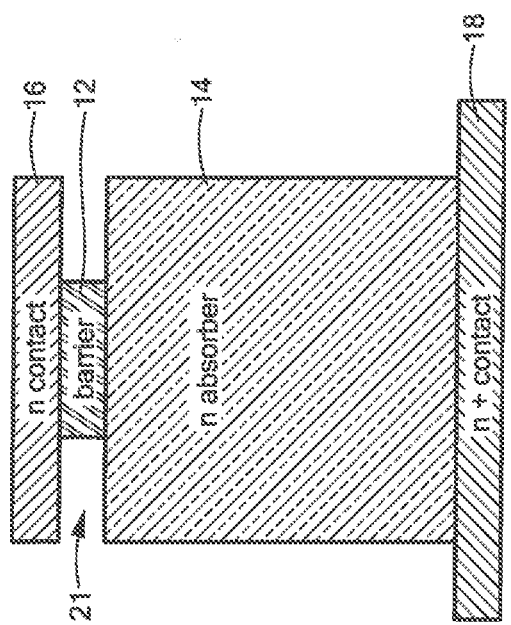
FIG. 1C is a cross sectional view of an exemplary one of the infrared photodetector pixel elements of FIG. 1D after outer peripheral portions of the barrier layer has been selectively removed while leaving outer peripheral portions of the upper and lower layers according to the disclosure.
Figure 2B:
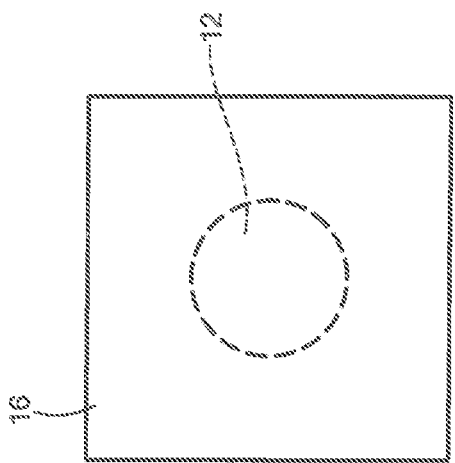
FIG. 2B is a top view of the exemplary one of the infrared photodetector pixel elements of FIG. 1C.

Next, referring to FIGS. 1C and 2B, the structure is subjected to here, for example, a timed, wet etch chemistry of, here for example, a solution of HCl and $H_2O_2$ to selectively remove edge exposed regions of the barrier layer 12 while leaving unetched the layers 14, 16 and 18 producing the structure as shown. More particularly, the undercutting etch is selective to Al containing semiconductors like AlAsSb. It attacks AlGaAsSb. It should be noted that other wet selective etches or even a dry selective etch may be used. In any event, the surface area of the barrier layer 12 (when viewed from the top of the structure looking downward) is reduced. When viewed in cross section as in FIG. 1C, the cross sectional area of the barrier layer 12 is reduced. It should also be noted that a gap 21 is, as a result of the selective etching process, formed between the upper and lower layers 14, 16, such gap 21 having as sidewalls remaining portions of the barrier layer 12. Next, referring to FIGS. 1D and 2C, the structure is placed in a vacuum chamber, not shown, to deposit, here for example, grow by atomic layer deposition, a dielectric or polymer back-fill material, 24, here, for example, silicon dioxide.

Figure 3:
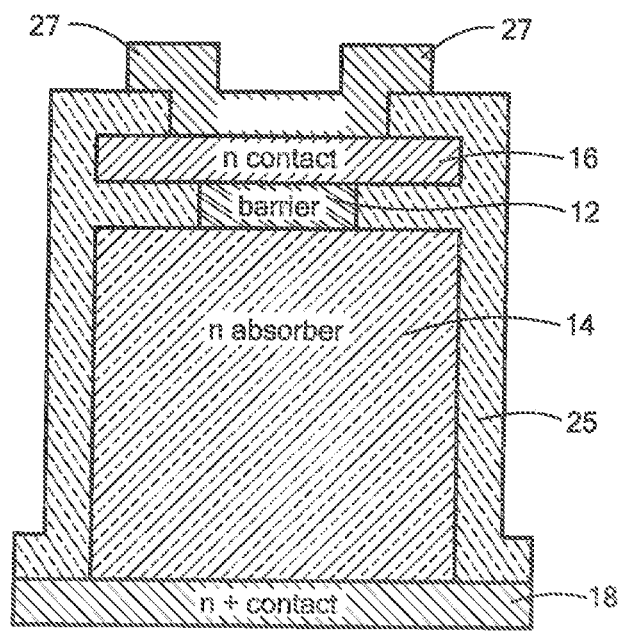
FIG. 3 is a cross sectional sketch of an exemplary one of the photodetector pixel elements formed in accordance with FIGS. 1A-1D and 2A-2C after passivation and metallization according to the disclosure.
Figure 4B:
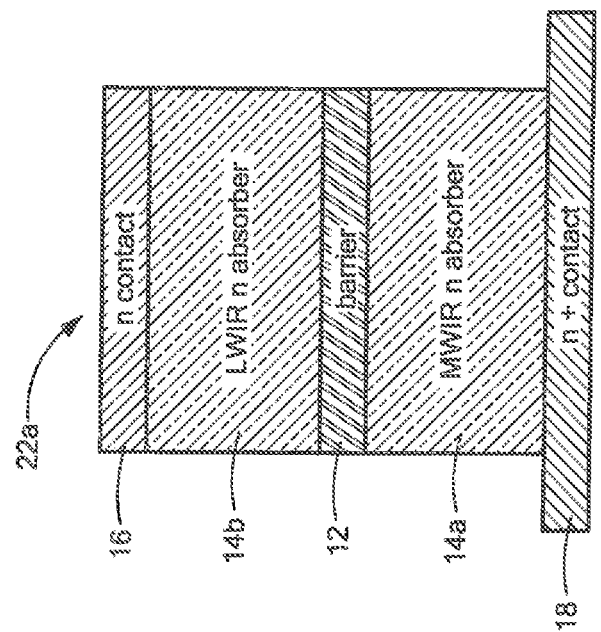
FIGS. 4A-4E show a photo detector pixel element at various stages in the fabrication thereof at various stages in the fabrication thereof according to another embodiment of the disclosure.
Figure 4A:
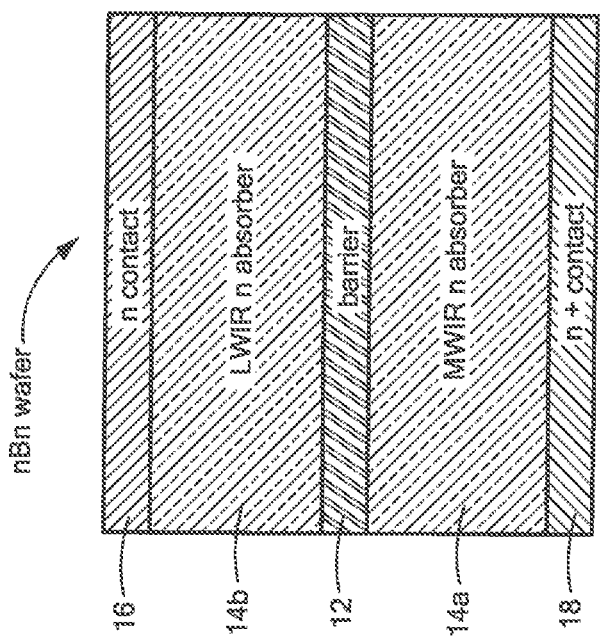
Figure 4C:
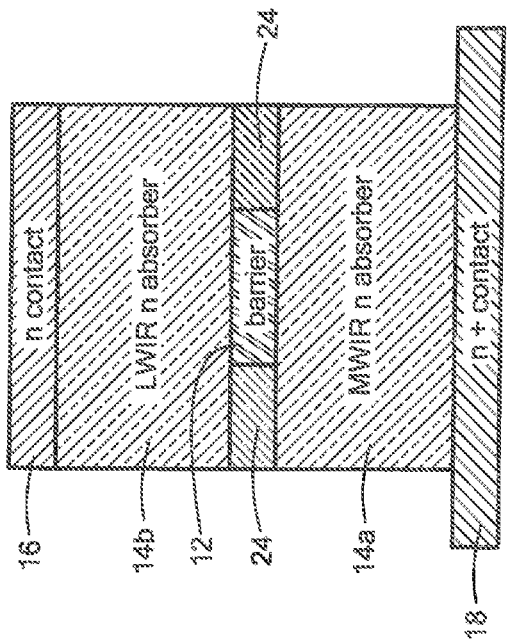
Figure 4D:
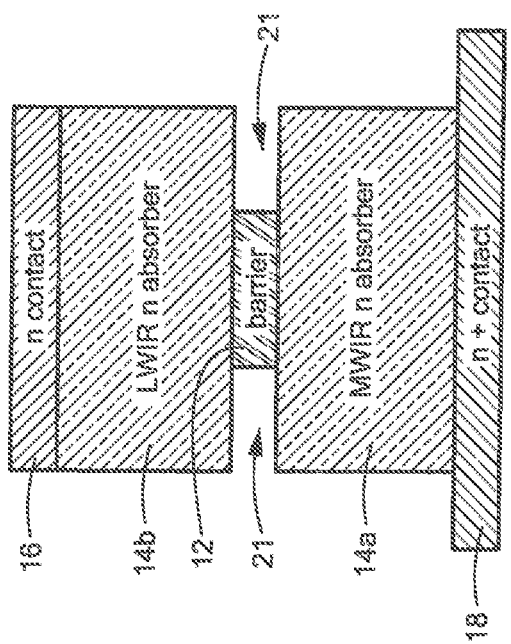
Figure 4E:
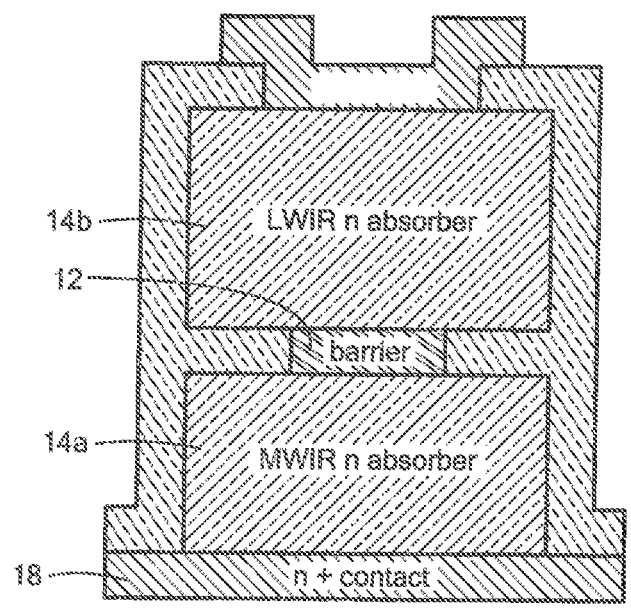

Next, the structure is passivated with any suitable passivation layer 25 and metalized with contacts 27 as Shown on FIG. 3 for an exemplary one of the photodetectors 22.

Referring now to FIGS. 4A-4E a photodetector pixel element includes in addition to layers 12 and 18 and barrier layer 14, a pair of n absorber layers 14a and 14b disposed on opposite sides of the barrier layer 18; for example, n absorber layer 14a absorbs IR radiation having one wavelength and n absorber layer 14b absorbs long IR radiation at a different wavelength.

A number of embodiments of the disclosure have been described. Nevertheless, it will be understood that various modifications may be made without departing from the spirit and scope of the disclosure. For example, the wafer 10 may be a pBp wafer. Further, the photodetector may be used in an array, such as a focal plane array. Accordingly, other embodiments are within the scope of the following claims.

What is claimed:

1. A photodetector structure comprising: a barrier layer disposed between a pair of like-conductivity doped semiconductor layers for preventing majority carriers from passing between the pair of like-conductivity layers, the barrier layer having a surface area smaller than the surface area of both the pair of like-conductivity doped semiconductor layers; and a metal contact layer disposed on the an upper one of the pair of like-conductivity doped semiconductor layers, the metal contact layer being disposed vertically over the barrier layer with the upper one of the pair of like-conductivity doped semiconductor layers being disposed between the barrier layer and the metal contact layer.

2. The photodetector recited in claim 1 including a fill material disposed between outer peripheral edges of the barrier layer and a region between outer peripheral edges of the pair of like-conductively doped semiconductor layers.

3. The photodetector structure recited in claim 1 wherein the barrier layer is in direct contact with the pair of like-conductively doped semiconductor layers.

4. The photodetector structure recited in claim 2 wherein the barrier layer is in direct contact with the pair of like-conductively doped semiconductor layers.

5. A photodetector structure comprising:
a vertical structure, comprising:
a pair of like-conductively doped semiconductor layers extending horizontally within the vertical structure and edges of the pair of like-conductively doped semiconductor layers providing portions of an outer wall of the vertical structure; and
a barrier layer disposed between a pair of like-conductively doped semiconductor layers and between, and spaced from, the outer wall of the vertical structure, the pair of like-conductively doped semiconductor layers having outer edges extending laterally beyond outer edges of the barrier layer.

6. The photodetector structure recited in claim 5 wherein the barrier layer is in direct contact with the pair of like-conductively doped semiconductor layers.

7. The photodetector structure recited in claim 5 including a metal contact layer disposed on the an upper one of the pair of like-conductivity doped semiconductor layers, the metal contact layer being disposed vertically over the entire barrier layer with the upper one of the pair of like-conductivity doped semiconductor layers being disposed vertically between the barrier layer and the metal contact layer.

8. The photodetector structure recited in claim 7 wherein the metal contact layer has outer edges extending horizontally beyond outer edges of the barrier layer.

9. The photodetector structure recited in claim 7 wherein the metal contact layer is in direct contact with the upper one of the pair of like-conductivity doped semiconductor layers.

\* \* \* \* \*